US010607967B2

(12) United States Patent
Kawai et al.

(10) Patent No.: US 10,607,967 B2
(45) Date of Patent: Mar. 31, 2020

(54) LIGHT EMITTING DEVICE, BACKLIGHT DEVICE, AND MANUFACTURING METHOD OF LIGHT EMITTING DEVICE

(71) Applicant: OMRON Corporation, Kyoto (JP)

(72) Inventors: Wakahiro Kawai, Konan (JP); Kazuyuki Otake, Tsurugashima (JP)

(73) Assignee: OMRON Corporation, Kyoto (JP)

(*) Notice: Subject to any disclaimer, the term of this patent is extended or adjusted under 35 U.S.C. 154(b) by 32 days.

(21) Appl. No.: 15/750,843

(22) PCT Filed: Nov. 25, 2016

(86) PCT No.: PCT/JP2016/085015
§ 371 (c)(1),
(2) Date: Feb. 7, 2018

(87) PCT Pub. No.: WO2017/130553
PCT Pub. Date: Aug. 3, 2017

(65) Prior Publication Data

US 2018/0233493 A1 Aug. 16, 2018

(30) Foreign Application Priority Data

Jan. 27, 2016 (JP) ................................ 2016-013708

(51) Int. Cl.
*H01L 33/54* (2010.01)
*H01L 25/075* (2006.01)
(Continued)

(52) U.S. Cl.
CPC ........ *H01L 25/0753* (2013.01); *G02B 6/0073* (2013.01); *G02B 6/0083* (2013.01);
(Continued)

(58) Field of Classification Search
CPC ........ H01L 33/54; H01L 33/56; H01L 33/486
See application file for complete search history.

(56) References Cited

U.S. PATENT DOCUMENTS

2002/0123163 A1* 9/2002 Fujii .................... H01L 33/486 438/26
2004/0061440 A1* 4/2004 Imai .................... G02B 6/0028 313/512

(Continued)

FOREIGN PATENT DOCUMENTS

EP 2874190 5/2015
JP S64-25582 1/1989

(Continued)

OTHER PUBLICATIONS

Office Action of China Counterpart Application, with English translation thereof, dated Feb. 1, 2019, pp. 1-16.

(Continued)

*Primary Examiner* — Andrew J Coughlin
(74) *Attorney, Agent, or Firm* — JCIPRNET

(57) ABSTRACT

In order to be more compact and thin, this light emitting device includes LED elements embedded in a resin molded body such that light emitting units are exposed on a lateral surface of the resin molded body and positive electrodes and negative electrodes are exposed on a back surface which is perpendicular to the lateral surface of the resin molded body.

20 Claims, 5 Drawing Sheets

(51) Int. Cl.

| | |
|---|---|
| ***F21V 8/00*** | (2006.01) |
| ***H01L 33/00*** | (2010.01) |
| ***H01L 33/36*** | (2010.01) |
| ***H01L 33/62*** | (2010.01) |
| *H01L 33/48* | (2010.01) |
| *H01L 33/56* | (2010.01) |
| *H01L 51/52* | (2006.01) |
| *H01L 51/56* | (2006.01) |

(52) U.S. Cl.

CPC .......... *H01L 33/0079* (2013.01); *H01L 33/36* (2013.01); *H01L 33/54* (2013.01); *H01L 33/62* (2013.01); *G02B 6/009* (2013.01); *G02B 6/0068* (2013.01); *H01L 33/486* (2013.01); *H01L 33/56* (2013.01); *H01L 51/5206* (2013.01); *H01L 51/5221* (2013.01); *H01L 51/5253* (2013.01); *H01L 51/56* (2013.01); *H01L 2224/04105* (2013.01); *H01L 2224/06181* (2013.01); *H01L 2224/16225* (2013.01); *H01L 2224/24137* (2013.01); *H01L 2224/2518* (2013.01); *H01L 2224/96* (2013.01); *H01L 2924/18162* (2013.01); *H01L 2933/005* (2013.01); *H01L 2933/0066* (2013.01)

(56) References Cited

U.S. PATENT DOCUMENTS

| | | | | |
|---|---|---|---|---|
| 2005/0167682 | A1* | 8/2005 | Fukasawa | H01L 33/60 257/79 |
| 2007/0121029 | A1* | 5/2007 | Fukuda | G02B 6/0056 349/64 |
| 2012/0104452 | A1* | 5/2012 | Miyoshi | H01L 25/0753 257/99 |
| 2012/0169968 | A1* | 7/2012 | Ishimori | G02B 6/0023 349/62 |
| 2015/0137164 | A1* | 5/2015 | Ichikawa | H01L 33/46 257/98 |
| 2015/0325760 | A1* | 11/2015 | Suenaga | H01L 33/56 257/99 |

FOREIGN PATENT DOCUMENTS

| | | |
|---|---|---|
| JP | H5-150807 | 6/1993 |
| JP | H9-179512 | 7/1997 |
| JP | H11-219961 | 8/1999 |
| JP | 2008-16297 | 1/2008 |
| JP | 2009-252419 | 10/2009 |
| JP | 2012-99545 | 5/2012 |
| JP | 2012146898 | 8/2012 |
| JP | 2014-241400 | 12/2014 |
| JP | 2015097235 | 5/2015 |
| JP | 2015-207703 | 11/2015 |
| WO | 2012001938 | 1/2012 |
| WO | 2014116035 | 7/2014 |
| WO | 2015163082 | 10/2015 |

OTHER PUBLICATIONS

"International Search Report (Form PCT/ISA/210) of PCT/JP2016/085015", dated Jan. 17, 2017, with English translation thereof, pp. 1-4.

"Written Opinion of the International Searching Authority (Form PCT/ISA/237)" of PCT/JP2016/085015, dated Jan. 17, 2017, with English translation thereof, pp. 1-12.

"Office Action of Japan Counterpart Application," dated Nov. 6, 2018, with English translation thereof, p. 1-p. 9.

"Office Action of Japan Counterpart Application," dated May 21, 2019, with English translation thereof, p. 1-p. 8.

"Search Report of Europe Counterpart Application", dated Jul. 12, 2019, p. 1-p. 8.

* cited by examiner

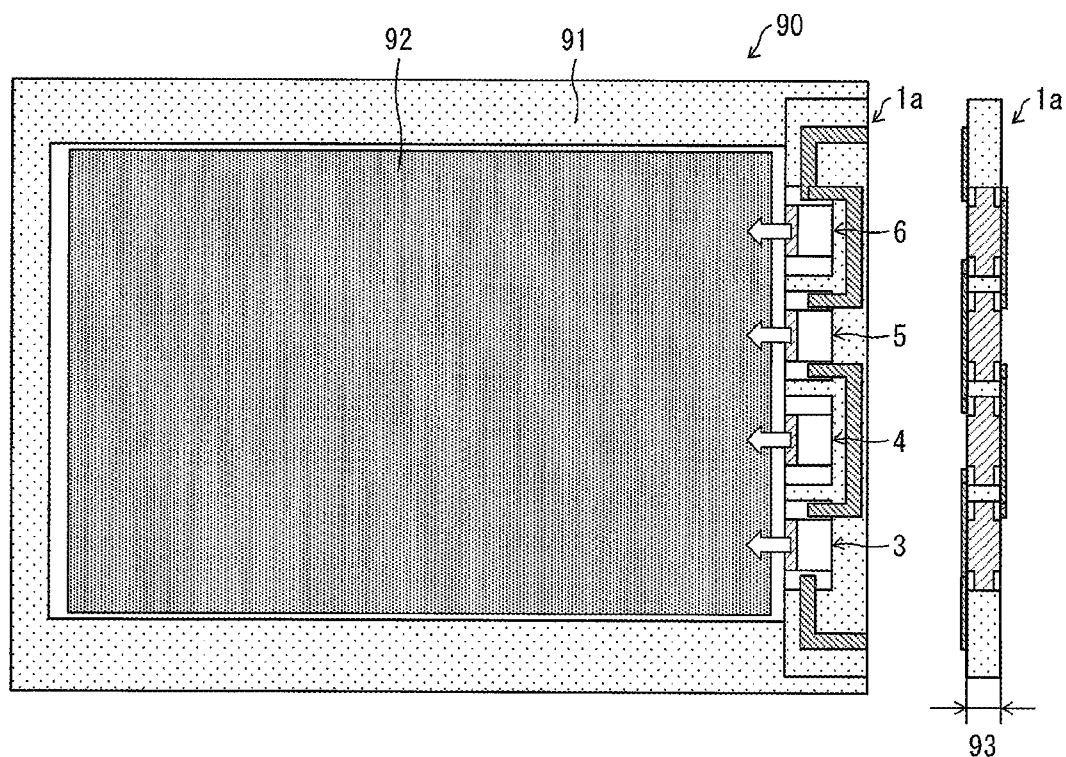
FIG. 6(a)
FIG. 6(b)
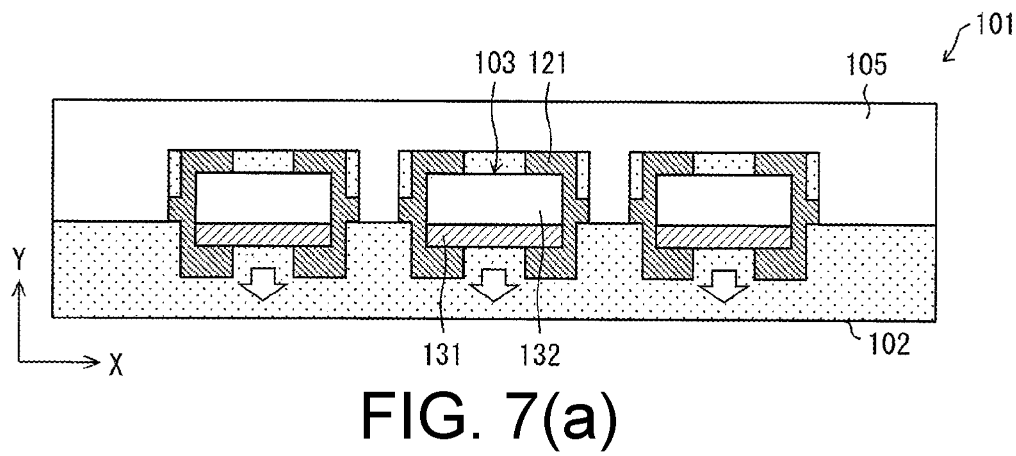
FIG. 7(a)
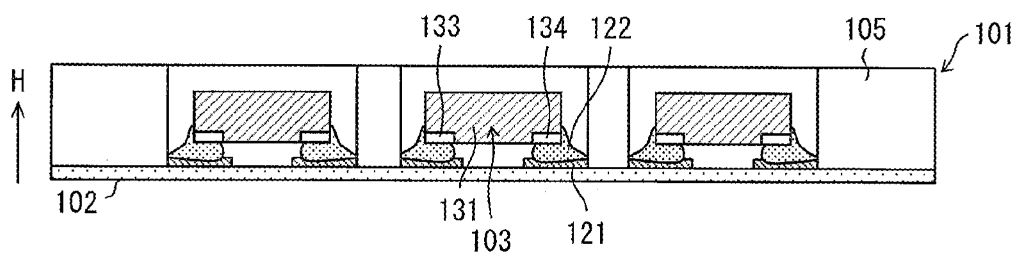
FIG. 7(b)

LIGHT EMITTING DEVICE, BACKLIGHT DEVICE, AND MANUFACTURING METHOD OF LIGHT EMITTING DEVICE

CROSS-REFERENCE TO RELATED APPLICATION

This application is a 371 application of the international PCT application serial no. PCT/JP2016/085015, filed on Nov. 25, 2016, which claims the priority benefit of Japan application no. 2016-013708, filed on Jan. 27, 2016. The entirety of each of the abovementioned patent applications is hereby incorporated by reference herein and made a part of this specification.

TECHNICAL FIELD

The present invention relates to a light emitting device including light emitting elements such as light emitting diode (LED) elements.

BACKGROUND ART

In the related art, a backlight including a plurality of light emitting diode (LED) elements is generally used as an electronic component configured to illuminate a liquid crystal display from a back surface thereof. Furthermore, there are edge light type and direct type systems as such a backlight, and an edge light type is used for a small liquid crystal used for a portable terminal or the like, a laptop type personal computer, a liquid crystal monitor, and the like.

In an edge light type backlight, a plurality of LED elements are arranged in any lateral surface of a plate-like light guide plate and the entire surface of a liquid crystal panel is irradiated with light through the light guide plate. Since the number of required LED elements is smaller in such a type than that of a direct type, the edge light type backlight has advantages such as low cost, energy saving, and a liquid crystal display which can be made thin.

In recent years, an edge light type backlight is required to be thinner than in the related art, and molding processing used to make a plate-like light guide plate to 0.3 mm or less or an LED element with a thickness of 0.3 mm is being developed.

In the related art, in order to arrange a plurality of LED elements for a backlight, a method for soldering the LED elements in a printed board using a solder material is mainly performed. However, such a method has a limitation on further thinning of the backlight.

FIGS. 7(*a*) and (*b*) are diagrams showing a configuration of a light emitting device 101 according to the related art. As shown in FIG. 7(*a*), the light emitting device 101 includes a printed board 102 and a plurality of LED elements 103. Furthermore, as shown in FIGS. 7(*a*) and (*b*), each of the LED elements 103 includes a base part 131, a light emitting unit 132, a positive electrode 133, and a negative electrode 134.

The light emitting unit 132 constituted of a light emitting diode is provided in a first surface of the base part 131. In addition, the positive electrode 133 and the negative electrode 134 are provided in a second surface which is perpendicular to the first surface of the base part 131. In each of LED elements 103, the positive electrode 133 and the negative electrode 134 are connected to the wiring 121 using a solder material 122 to be mounted in the front surface of the printed board 102.

However, like in the light emitting device 101 illustrated in FIGS. 7(*a*) and (*b*), since a thickness of a printed board 102, a thickness of the wiring 121, a floating thickness of a joint using the solder material 122, and a thickness of a space required for assembly of the printed board 102 and the resin casing 105 are required in a configuration in which the LED elements 103 are mounted in the front surface of the printed board 102, there is a problem in that a height (thickness in an H direction) of the light emitting device 101 is obtained by adding a thickness of at least about 0.1 mm to a thickness of the LED element 103.

As a countermeasure against such a problem, the light emitting device 101*a* of a configuration illustrated in FIGS. 8(*a*) and (*b*) can be considered.

FIGS. 8(*a*) and (*b*) are diagrams showing a configuration of a light emitting device 101*a* according to the related art. In the light emitting device 101*a* illustrated in the drawing, the positive electrode 133 and the negative electrode 134 are provided in an opposite side to the light emitting unit 132 of the LED element 103 and connected to the wiring 121 in the printed board 102 via a solder material 104. Since a height (thickness in an H direction) of the printed board 102 is substantially the same as a height of the LED element 103 in such a configuration, a thickness of the light emitting device 101*a* can be made as thin as a thickness of the LED element 103.

FIG. 8 is a diagram showing a configuration of a light emitting device 101*a* according to the related art. In the light emitting device 101*a* illustrated in the drawing, the positive electrode 133 and the negative electrode 134 are provided in an opposite side to the light emitting unit 132 of the LED element 103 and connected to the wiring 121 in the printed board 102 via a solder material 104. Since a height (thickness in an H direction) of the printed hoard 102 is substantially the same as a height of the LED element 103 in such a configuration, a thickness of the light emitting device 101*a* can be made as thin as a thickness of the LED element 103.

However, in order to realize the light emitting device 101*a* with such a configuration, it is necessary to prepare the printed board 102 with a narrow width such as 0.3 mm. Since processing of obtaining such a printed board 102 is very difficult, there is a problem regarding an increase in manufacturing costs of the light emitting device 101*a*. In addition, since a connection area between the LED element 103 and the printed board 102 is decreased, there is also concern that a mounting strength of the LED element 103 will be insufficient.

In addition, miniaturization of a light emitting device is required due to an increasing demand for miniaturization and thinning of electronic devices in recent years. However, in the light emitting device 101 (101*a*) obtained through a mounting method using the solder material 122 in the related art, it is necessary to secure an installation space of the solder material 122 in the light emitting device 101 (101*a*) in view of wet spreading of the solder material 122, securing a mounting strength, or the like. Therefore, there is a limit to miniaturization of the light emitting device 101 (101*a*).

Thus, in the related art, various proposals have been provided as countermeasures to deal with positional deviation of an LED at the time of surface mounting using a solder material.

Patent Literature 1 discloses a method for fixing an LED mounting position by forming a groove in the LED mounting position in a printed board and inserting an LED member joined to a dummy having a dimension which is the same as a mounting pitch of an LED into the groove.

Patent Literature 2 discloses a method for fixing an LED mounting position by putting an adhesive into a hole formed in a printed board, mounting an LED above the adhesive, and curing the adhesive.

Patent Literature 3 discloses a method for fixing an LED mounting position by assembling an LED and a positioned member and then soldering the LED to a circuit of a printed board.

REFERENCE LIST

Patent Literature

Patent Literature 1: Japanese Patent Application Laid-Open (JP-A) No. S64-25582 (published on Jan. 27, 1989)

Patent Literature 2: Japanese Patent Application Laid-Open (JP-A) No. H11-219961 (published on Aug. 10, 1999)

Patent Literature 3: Japanese Patent Application Laid-Open (JP-A) No. 2008-16297 (published on Jan. 24, 2008)

Patent Literature 4: Japanese Patent Application Laid-Open (JP-A) No. H5-150807 (published on Jul. 30, 1993)

Patent Literature 5: Japanese Patent Application Laid-Open (JP-A) No. H9-179512 (published on Jul. 11, 1997)

SUMMARY

Technical Problem

However, in the related art, it is difficult to realize accuracy of an LED mounting position in units of microns in view of processing accuracy of a board, processing accuracy of a dummy member, an assembly member, and the like. In addition, since a processing space for a groove or a hole or an installation space for a dummy member or an assembly member is required, there is a problem regarding an increase in size of a light emitting device. There is also a problem regarding a decrease in manufacturing yield due to complicated manufacturing processes such as additional processing of a printed board or an increase in manufacturing costs due to preparation of an assembly member.

The present invention was made to solve the above-described problems. Moreover, an object of the present invention is to realize a light emitting device which is further miniaturized and thinned, a backlight device including such a light emitting device, and a manufacturing method for more easily manufacturing such a light emitting device.

Solution to Problem

In order to solve the above-described problems, a light emitting device according to an aspect of the present invention includes: a resin molded body; a light emitting element including at least a light emitting unit and an electrode and embedded in the resin molded body so that the light emitting unit is exposed on a first surface in the resin molded body and the electrode is exposed on a second surface which is perpendicular to the first surface in the resin molded body; and a wiring formed in the second surface in the resin molded body and connected to the electrode.

In order to solve the above-described problems, a backlight device according to an aspect of the present invention includes: a light guide plate; and the light emitting devices described above arranged to face any lateral surface of the light guide plate.

In order to solve the above-described problems, a manufacturing method of a light emitting device according to an aspect of the present invention includes: a step of temporarily fixing a light emitting element including at least a light emitting unit and an electrode formed in a surface which is perpendicular to a surface in which the light emitting unit is formed to a temporary fixing film in such a way that the electrode is in contact with the temporary fixing film; a step of forming a resin molded body in which the light emitting element is embedded by arranging the temporary fixing film in which the light emitting element is temporarily fixed in a gap in a mold and injecting a resin material into the gap; a step of peeling the temporary fixing film off the resin molded body; and a step of forming a wiring connected to the electrode in a surface on which the electrode in the resin molded body is exposed.

Advantageous Effects of Invention

According to the present invention, a more compact and thinner light emitting device, a backlight device including such a light emitting device, and a manufacturing method for more easily manufacturing such a light emitting device can be realized.

BRIEF DESCRIPTION OF THE DRAWINGS

FIGS. 6(*a*) and (*b*) are diagrams showing a configuration of a backlight device according to Embodiment 3 of the present invention.

FIGS. 7(*a*) and (*b*) are diagrams showing a configuration of a light emitting device in the related art.

DESCRIPTION OF THE EMBODIMENTS

Embodiment 1

Embodiment 1 of the present invention will be described below with reference to FIGS. 1(*a*) to (*c*) and 2.

Figure 1A:
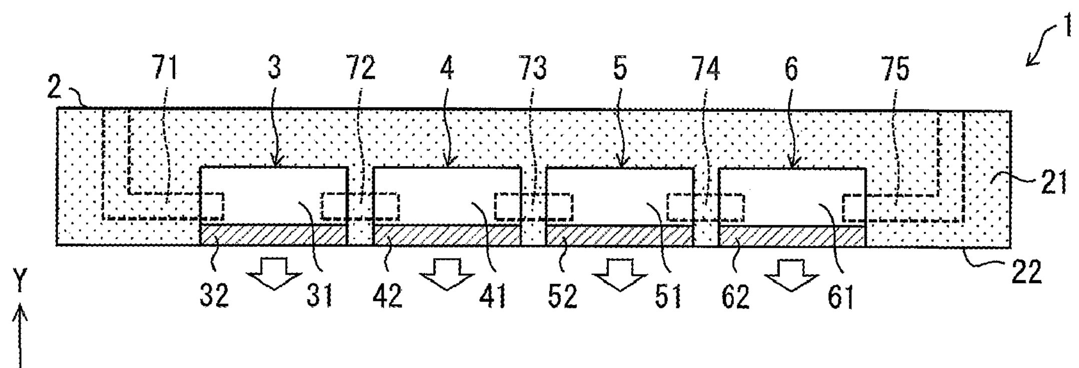
FIGS. 1(*a*) to (*c*) are diagrams showing a configuration of a light emitting device according to Embodiment 1 of the present invention.
Figure 1B:
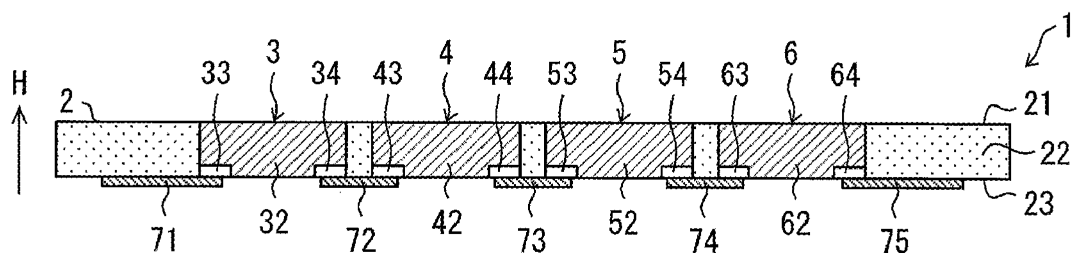
Figure 1C:
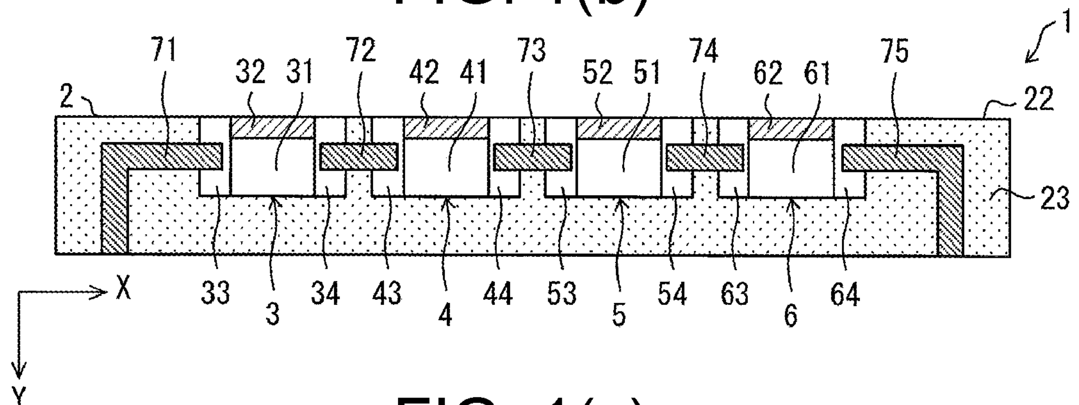

FIGS. 1(*a*) to (*c*) are diagrams showing a configuration of a light emitting device 1 according to Embodiment 1 of the present invention. FIG. 1(*a*) is a diagram of the light emitting device 1 viewed from a light emitting surface (front surface) thereof, FIG. 1(*b*) is a diagram of the light emitting device 1 viewed from a surface which is perpendicular to the light emitting surface (a lateral surface), and FIG. 1(*c*) is a diagram of the light emitting device 1 viewed from a surface which is opposite to the light emitting surface (a back surface).

As shown in FIGS. 1(*a*) to (*c*), the light emitting device 1 includes a resin molded body 2, light emitting diode (LED) elements 3 to 6, and wirings 71 to 75.

The resin molded body 2 serves as a board of the light emitting device 1 and is constituted of various resin materials. Examples of such materials include polycarbonate (PC) or acrylonitrile butadiene styrene (ABS).

The LED elements 3 to 6 are surface mount (SMD) type LED elements. As shown in FIGS. 1(*a*) to (*c*), the LED element 3 includes a base part 31, a light emitting unit 32, a positive electrode (electrode) 33, and a negative electrode (electrode) 34. The LED element 4 includes a base part 41, a light emitting unit 42, a positive electrode (electrode) 43, and a negative electrode (electrode) 44. The LED element 5 includes a base part 51, a light emitting unit 52, a positive electrode (electrode) 53, and a negative electrode (electrode) 54. The LED element 6 includes a base part 61, a light emitting unit 62, a positive electrode (electrode) 63, and a negative electrode (electrode) 64.

The base part 31 is a main body of the LED element 3. The light emitting unit 32 constituted of an LED is formed in a lateral surface of the base part 31. When the LED element 3 emits light, the light is emitted from the light emitting unit 32. The positive electrode 33 and the negative electrode 34 are connection electrodes connected to an external part of the light emitting device 1 or any of the LED elements 4 to 6 in the light emitting device 1. The positive electrode 33 and the negative electrode 34 are formed in a back surface (a second surface) which is perpendicular to the lateral surface of the base part 31.

Since a detailed configuration of the LED elements 4 to 6 is the same as that of the LED element 3, detailed description thereof will be omitted.

The LED elements 3 to 6 are embedded in the resin molded body 2. As shown in FIGS. 1(*a*) to (*c*), in the light emitting device 1, a plurality of (four) LED elements 3 to 6 are linearly arranged. As shown in FIG. 1(*b*), the light emitting units 32 to 62 are exposed on a lateral surface 22 of the resin molded body 2. Therefore, as indicated by an arrow in FIG. 1(*a*), when the light emitting device 1 emits light, the light is emitted from the lateral surface 22 of the resin molded body 2.

As shown in FIG. 1(*c*), the positive electrodes 33 to 63 and the negative electrodes 34 to 64 are exposed on a back surface 23 which is perpendicular to the lateral surface 22 of the resin molded body 2.

Wirings 71 to 75 are formed on the back surface 23 of the resin molded body 2 and are connected to at least any of the corresponding positive electrodes 33 to 63 or negative electrodes 34 to 64. The wirings 71 to 75 are formed on the back surface 23 of the resin molded body 2 using printing through, for example, a printing method using silver ink or the like. Therefore, a solder material is not required for a connection between the wirings 71 to 75 and the positive electrodes 33 to 63 or the negative electrodes 34 to 64.

As shown in FIGS. 1(*a*) to (*c*), one end of the wiring 71 is connected to the positive electrode 33. The other end of the wiring 71 is connected to a drive circuit (not shown) outside of the light emitting device 1. One end of the wiring 72 is connected to the negative electrode 34 and the other end thereof is connected to the positive electrode 43. In this way, the wiring 72 serves to connect the LED element 3 and the LED element 4.

One end of the wiring 73 is connected to the negative electrode 44 and the other end thereof is connected to the positive electrode 53. In this way, the wiring 73 serves to connect the LED element 4 and the LED element 5.

One end of the wiring 74 is connected to the negative electrode 54 and the other end thereof is connected to the positive electrode 63. In this way, the wiring 74 serves to connect the LED element 5 and the LED element 6.

One end of the wiring 75 is connected to the negative electrode 64. The other end of the wiring 75 is connected to the drive circuit (not shown) outside of the light emitting device 1.

Figure 2:
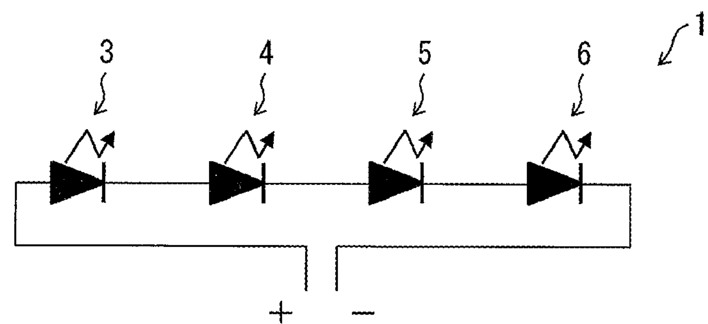
FIG. 2 is a diagram showing an equivalent circuit of the light emitting device according to Embodiment 1 of the present invention.

FIG. 2 is a diagram showing an equivalent circuit of the light emitting device 1 according to Embodiment 1 of the present invention. As shown in FIGS. 1(*a*) to (*c*), the LED elements 3 to 6 are connected to each other in series using the wirings 71 to 75. Therefore, as shown in FIG. 2, an equivalent circuit in which the LED elements 3 to 6 are connected to each other in series is formed in the light emitting device 1. Once the LED elements 3 to 6 are driven using the external drive circuit, the LED elements 3 to 6 emit light at the same time.

The light emitting device 1 according to the embodiment is suitably utilized as a light emitting device in which the LED elements 3 and 6 are arranged on a straight line, which can be incorporated in an edge light type backlight device.

Advantages of Embodiment

The light emitting device 1 illustrated in FIGS. 1(*a*) to (*c*) do not have a printed board which is necessary for a light emitting device according to the related art and does not need a solder material for connecting a wiring and electrodes (positive electrode and negative electrodes). Thus, the following effects which contribute to miniaturizing and thinning of the light emitting device 1 can be obtained.

(1) Since a height of the light emitting device 1 can be reduced to a minimum value that is substantially the same as a height of the LED elements 3 to 6, the light emitting device 1 can be thinned.

(2) Since spaces among the LED elements 3 to 6 necessary for connection between electrodes and wirings of the LED elements using a solder material in the related art are not required for the light emitting device 1, pitches (intervals among the LED elements 3 to 6) when the LED elements 3 to 6 are mounted in the light emitting device 1 can be made smaller than those of the related art.

(3) Since the LED elements 3 to 6 are embedded in the resin molded body 2, a mounting strength of an LED element 3 is higher than a connection structure using a solder material like in the related art.

(Modification)

The light emitting device 1 may be constituted of a light emitting element other than the LED elements 3 to 6, for example, an organic electro luminescence (EL) element or the like.

Embodiment 2

Embodiment 2 of the present invention will be described below with reference to FIGS. 3(*a*) to (*c*) to FIGS. 5(*a*) to (*d*). Note that, for convenience of explanation, members having functions that are the same as those of the members described in the above-described embodiment will be denoted with the same reference numerals and description thereof will be omitted.

Figure 3A:
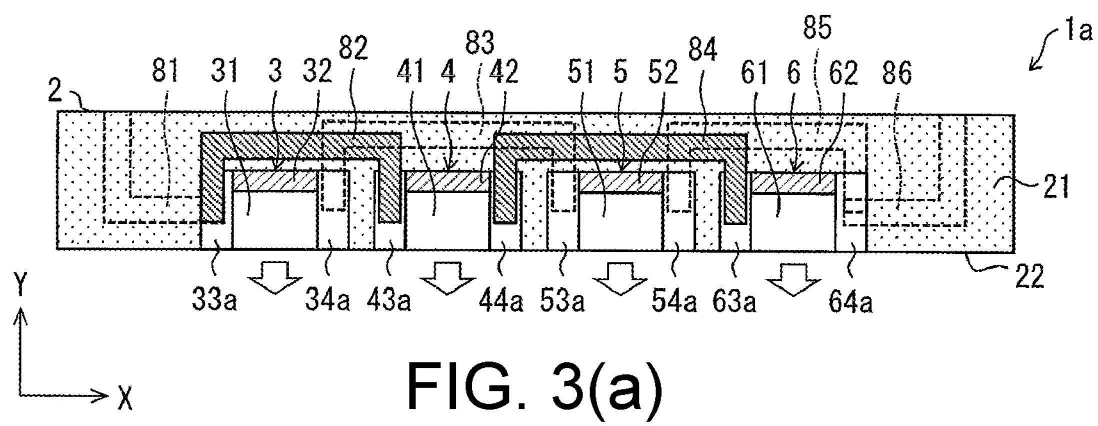
FIGS. 3(*a*) to (*c*) are diagrams showing a configuration of a light emitting device according to Embodiment 2 of the present invention.
Figure 3B:
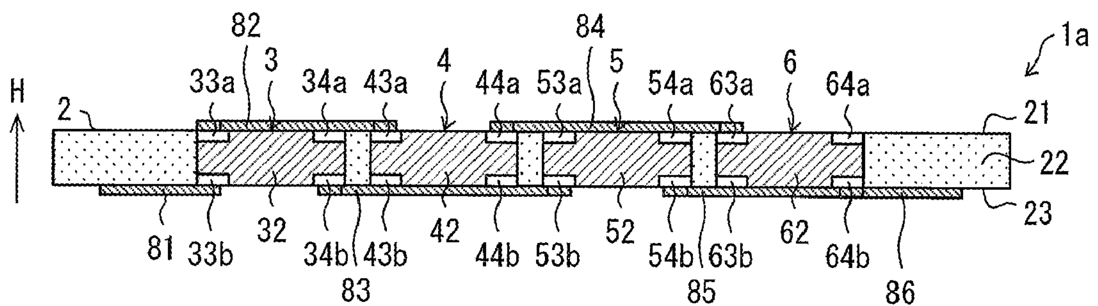
Figure 3C:
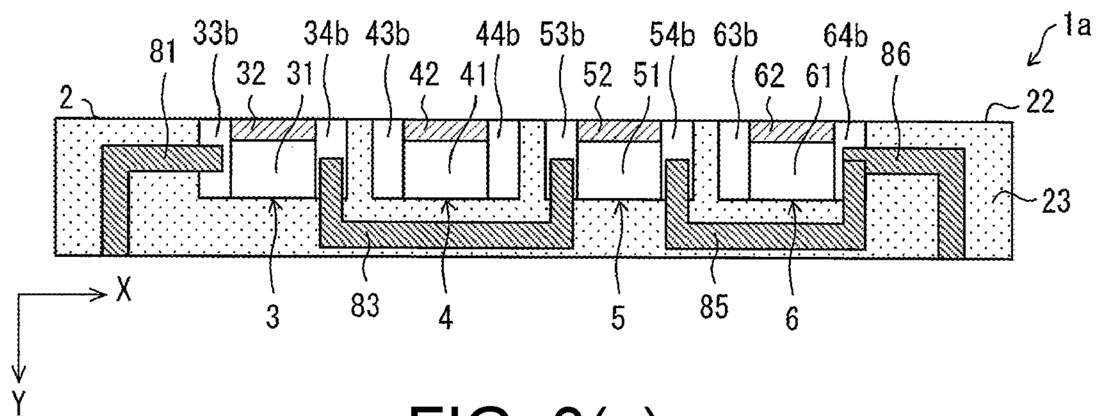

FIGS. 3(*a*) to (*c*) are diagrams showing a configuration of a light emitting device 1*a* according to Embodiment 2 of the present invention. FIG. 3(*a*) is a diagram of the light emitting device 1*a* viewed from a light emitting surface (front surface) thereof, FIG. 3(*b*) is a diagram of the light emitting device 1*a* viewed from a surface which is perpendicular to the light emitting surface thereof (a lateral surface), and FIG. 3(*c*) is a diagram of the light emitting device 1*a* viewed from a surface which is opposite to the light emitting surface thereof (a back surface).

As shown in FIGS. 3(*a*) to (*c*), the light emitting device 1*a* includes a resin molded body 2, LED elements 3 to 6, and wirings 81 to 86. The LED element 3 includes a base part 31, a light emitting unit 32, a positive electrode 33*a* (another electrode), a positive electrode 33*b* (electrode), a negative electrode 34*a* (another electrode), and a negative electrode 34*b* (electrode). The LED element 4 includes a base part 41, a light emitting unit 42, a positive electrode 43*a* (another electrode), a positive electrode 43*b* (electrode), a negative electrode 44*a* (another electrode), and a negative electrode 44*b* (electrode). The LED element 5 includes a base part 51, a light emitting unit 52, a positive electrode 53*a* (another electrode), a positive electrode 53*b* (electrode), a negative electrode 54*a* (another electrode), and a negative electrode 54*h* (electrode). The LED element 6 includes a base part 61, a light emitting unit 62, a positive electrode 63*a* (another electrode), a positive electrode 63*b* (electrode), a negative electrode 64*a* (another electrode), and a negative electrode 64*b* (electrode).

In the LED element 3, the positive electrode 33*a* and the negative electrode 34*a* are formed in the front surface (a surface which is perpendicular to a surface in which the light emitting unit 32 is formed) in the base part 31. On the other hand, the positive electrode 33*b* and the negative electrode 34*b* are formed in the back surface (a surface which is perpendicular to the surface in which the light emitting unit 32 is formed) which is opposite to the front surface in the base part 31. The positive electrodes 33*a* and 33*b* are integrally formed in an LED element 3. In other words, the positive electrodes 33*a* and 33*b* are electrically connected to each other. Similarly, the negative electrodes 34*a* and 34*b* are integrally formed in the LED element 3. In other words, the negative electrodes 34*a* and 34*b* are electrically connected to each other.

Since a detailed configuration of the LED elements 4 to 6 is the same as that of the LED element 3, detailed description thereof will be omitted.

As shown in FIG. 3(*a*), the positive electrodes 33*a* to 63*a* and the negative electrodes 34*a* to 64*a* are exposed on a front surface 21 (third surface) which is perpendicular to the lateral surface 22 (first surface) of the resin molded body 2. On the other hand, as shown in FIG. 3(*b*), the positive electrodes 33*b* to 63*b* and the negative electrodes 34*b* to 64*b* are exposed on the back surface 23 (second surface) which is perpendicular to the lateral surface 22 of the resin molded body 2 and is opposite to the front surface 21.

The wirings 81 to 86 are formed in the front surface 21 or the back surface 23 of the resin molded body 2 and are connected to at least any of the corresponding positive electrodes 33*a* to 63*a*, positive electrodes 33*b* to 63*b*, negative electrodes 34*a* to 64*a*, or negative electrodes 34*b* to 64*b*. The wirings 81 to 85 are formed on the front surface 21 or the back surface 23 of the resin molded body 2 using printing through, for example, a printing method using silver ink or the like. Therefore, a solder material is not required for a connection between the wirings 81 to 85 and the positive electrodes 33*a* to 63*a*, the positive electrodes 33*b* to 63*b*, the negative electrodes 34*a* to 64*a*, or the negative electrodes 34*b* to 64*b*.

As shown in FIG. 3(*c*), one end of the wiring 81 is connected to the positive electrode 33*b*. The other end of the wiring 81 is connected to a drive circuit (not shown) outside of the light emitting device 1*a*. One end of the wiring (another wiring) 82 is connected to the positive electrode 33*a* and the other end thereof is connected to the positive electrode 43*a*. In this way, the wiring 82 serves to connect the positive electrode 33*a* of the LED element 3 and the positive electrode 43*a* of the LED element 4.

One end of the wiring 83 is connected to the negative electrode 34*b* and the other end thereof is connected to the positive electrode 53*b*. In this way, the wiring 73 serves to connect the LED element 3 and the LED element 5.

One end of the wiring 84 (another wiring) is connected to the negative electrode 44*a* and the other end thereof is connected to the positive electrode 63*a*. In this way, the wiring 84 serves to connect the LED element 4 and the LED element 6.

One end of the wiring 85 is connected to the negative electrode 54*b* and the other end thereof is connected to the negative electrode 64*b*. In this way, the wiring 85 serves to connect the negative electrode 54*b* of the LED element 5 and the negative electrode 64*b* of the LED element 6.

One end of the wiring 86 is connected to the negative electrode 64*b*. The other end of the wiring 86 is connected to the drive circuit (not shown) outside of the light emitting device 1*a*.

As described above, in the light emitting device 1*a*, groups of wirings are formed in the front surface 21 and the back surface 23 of the resin molded body 2. The positive electrode 33*b* of the LED element 3 commonly connects the wiring 82 of the front surface 21 and the wiring 83 of the back surface 23. The negative electrode 64*b* of an LED element 6 commonly connects the wiring 84 of the front surface 21 and the wiring 85 of the back surface 23. With such a configuration, an equivalent circuit illustrated in FIG. 4 is formed in the light emitting device 1*a*.

Figure 4:
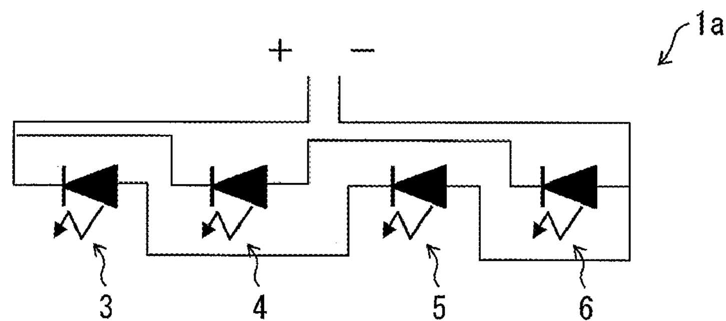
FIG. 4 is a diagram showing an equivalent circuit of the light emitting device according to Embodiment 2 of the present invention.
Figure 5A:
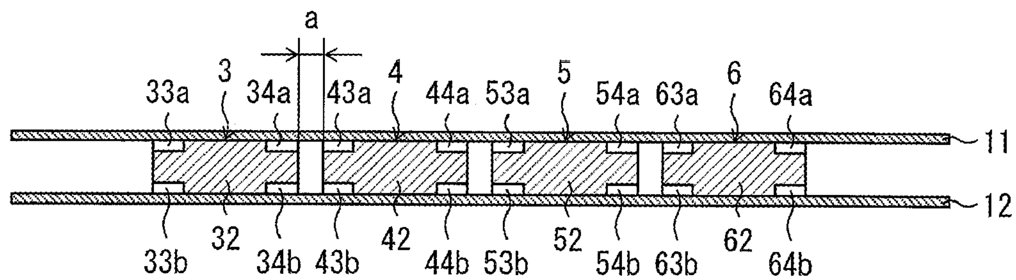
FIGS. 5(*a*) to (*d*) are diagrams for describing a method for manufacturing the light emitting device according to Embodiment 2 of the present invention.
Figure 5B:
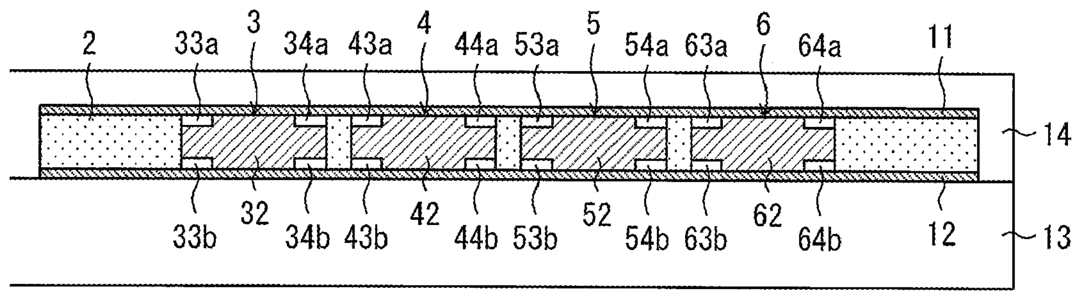
Figure 5C:
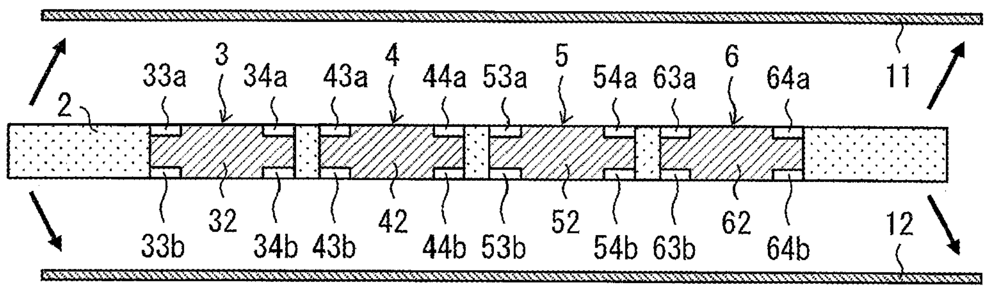
Figure 5D:
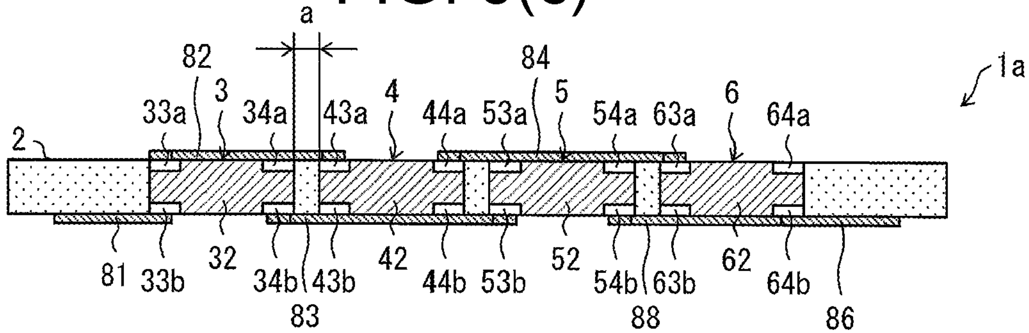
Figure 8A:
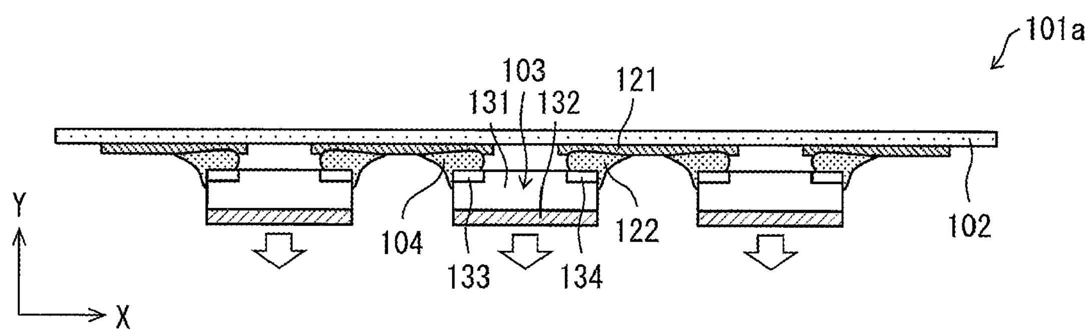
FIGS. 8(*a*) and (*b*) are diagrams showing a configuration of a light emitting device in the related art.
Figure 8B:
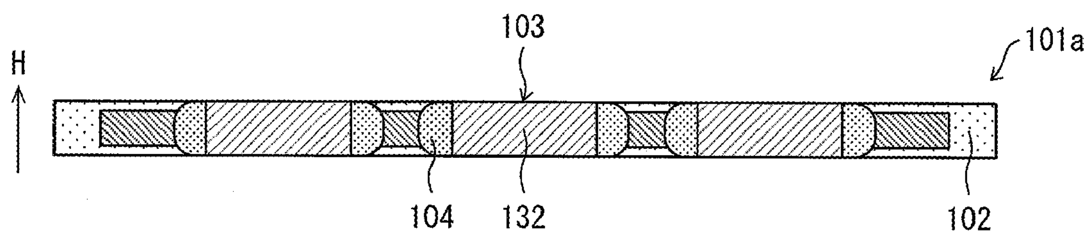

FIG. 4 is a diagram showing an equivalent circuit of the light emitting device 1*a* according to Embodiment 2 of the present invention. As shown in FIGS. 3(*a*) to (*c*), in the light emitting device 1*a*, the LED elements 3 and 5 are connected to each other in series using the wirings 82 and 84. Furthermore, the LED elements 4 and 6 are connected to each other in series using the wirings 83 and 85. In addition, the LED elements 3 and 5 and the LED elements 4 and 6 are connected to each other in parallel. Therefore, as shown in FIG. 2, in the light emitting device 1*a*, the equivalent circuit in which the LED elements 3 and 5 are connected to each other in series, the LED elements 4 and 6 are connected to each other in series, and the LED elements 3 and 5 and the LED elements 4 and 6 are connected to each other in parallel is formed.

When the LED elements 3 to 6 are driven using the external drive circuit, the LED elements 3 to 6 emit light at the same time. Furthermore, since there is no hindrance to electric power supply toward the LED elements 4 and 6 even when the LED elements 3 and 5 are turned off due to a disconnection occurring in the wiring 82 or 84 formed in the font surface 21 of the resin molded body 2, the LED elements 4 and 6 remain on. Conversely, since there is no hindrance to electric power supply to the LED elements 3 and 5 even when the LED elements 4 and 6 are turned off due to a disconnection occurring in the wiring 83 or 85 formed in the back surface 23 of the resin molded body 2, the LED elements 3 and 5 remain on. In this way, since only half of the LED elements 3 to 6 are turned off and half thereof remain on even when a disconnection has occurred in any of the wirings 82 to 84 in the light emitting device 1*a*, a certain degree of illuminance can be maintained even when a disconnection occurs.

The light emitting device 1*a* according to the embodiment is also suitably utilized as a light emitting device in which the LED elements 3 to 6 are arranged in a straight line, which can be incorporated in an edge light type backlight device.

(Manufacturing Method of Light Emitting Device 1*a*)

FIGS. 5(*a*) to (*d*) are diagrams for describing a method for manufacturing the light emitting device 1*a* according to the embodiment. The manufacturing method of the light emitting device 1*a* according to the embodiment will be described below with reference to the drawing.

(Temporary Fixing Process)

First, as shown in FIG. 5(*a*), temporary fixing films 11 and 12 for temporarily fixing the LED elements 3 to 6 were prepared and the LED elements 3 to 6 were temporarily fixed to the temporary fixing films 11 and 12. Examples of the temporary fixing films 11 and 12 include films made of polyethylene terephthalate (PET).

In the embodiment, the LED elements 3 to 6 were temporarily fixed to the temporary fixing films 11 and 12 using an adhesive or the like so that the positive electrodes 33*a* to 63*a* and the negative electrodes 34*a* to 64*a* of the LED elements 3 to 6 were in contact with the temporary fixing film 11 and the positive electrodes 33*b* to 63*b* and the negative electrodes 34*b* to 64*b* of the LED elements 3 to 6 were in contact with the temporary fixing film 12. For such temporary fixing, for example, an ultraviolet curable adhesive (not shown) applied to the temporary fixing films 11 and 12 could be used. To be specific, an adhesive was applied to the temporary fixing film 11 made of PET of 50 μm to have a thickness of 2 to 3 μm using GL-3005H manufactured by Gluelabo Ltd. as an adhesive.

Subsequently, positions of the LED elements 3 to 6 in the temporary fixing films 11 and 12 were determined and the LED elements 3 to 6 were installed in the positions determined in the temporary fixing films 11 and 12. After that, the adhesive was cured by irradiating the temporary fixing films 11 and 12 and the LED elements 3 to 6 with ultraviolet rays of 3000 $mJ/cm^2$. Thus, the LED elements 3 to 6 were temporarily fixed to the temporary fixing films 11 and 12.

(Injection Molding Process)

Subsequently, as shown in FIG. 5(*b*), the temporary fixing films 11 and 12 in which the LED elements 3 to 6 prepared in a temporary fixing process were temporarily fixed were arranged in a gap between a mold 13 and a mold 14 and then a resin material was injected into the gap. Thus, injection molding of a resin material was performed so that the LED elements 3 to 6 were embedded in the resin molded body 2.

Examples of a resin material used in such a process include various resin materials such as PC and ABS. When PC was used, PC was used at an injection temperature of 270° C. and an injection pressure of 100 Mpa. When ABS was used, ABS was used at an injection temperature of 180° C. and an injection pressure 20 $kgf/cm^2$.

(Peeling Process)

Subsequently, as shown in FIG. 5(*c*), an injection molding product obtained in the injection molding process was taken out from the gap between the mold 13 and the mold 14 and then the temporary fixing films 11 and 12 were peeled off the injection molding product. Thus, the light emitting units 32 to 62 of the LED elements 3 to 6 were exposed on the lateral surface 22 of the resin molded body 2. On the other hand, the positive electrodes 33*a* to 63*a* and the negative electrodes 34*a* to 64*a* of the LED elements 3 to 6 were exposed on the front surface 21 of the resin molded body 2 and the positive electrodes 33*b* to 63*b* and the negative electrodes 34*b* to 64*b* of the LED elements 3 to 6 were exposed on the back surface 23 of the resin molded body 2.

Note that a PET film used as the temporary fixing film 11 was greatly deformed due to heat during the injection molding in the injection molding process and was peeled off the injection molding product. For this reason, the temporary fixing film 11 can be easily peeled off the injection molding product.

(Wiring Forming Process)

Finally, as shown in FIG. 5(*d*), the wirings 82 and 84 connected to the positive electrodes 33*a* to 63*a* and the negative electrodes 34*a* to 64*a* of the LED elements 3 to 6 exposed on the front surface 21 of the resin molded body 2 are formed in the front surface 21 of the resin molded body 2. In addition, the wirings 81, 83, 85, and 86 connected to the positive electrodes 33*b* to 63*b* and the negative electrodes 34*h* to 64*h* of the LED elements 3 to 6 exposed on the back surface 23 of the resin molded body 2 were formed in the back surface 23 of the resin molded body 2. Thus, the light emitting device 1 was completed.

Various methods can be used for forming the wirings 81 to 86. Examples of such methods include a method for printing the wirings 81 to 86 by injecting a conductive material (for example, silver ink or the like) using an inkjet printer or the like, a method for forming the wirings 81 to 86 using an aerosol, a method for forming the wirings 81 to 86 using a dispenser, or the like.

According to the manufacturing method of the embodiment, a thickness of the manufactured light emitting device 1*a* can be formed to have a minimum thinness equal to a height (a thickness in an H direction) of the LED element 3. Furthermore, since a mounting distance (distance a illustrated in FIGS. 5(*a*) and (*d*)) between the LED elements 3 to 6 may be about 0.2 to 0.3 mm serving as a minimum distance in which the resin material flows during the injection molding process, arrangement of the LED elements 3 to 6 having narrow pitches in which the arrangement is impossible in the related art can be realized.

Advantages of Embodiment

In the manufacturing method of the light emitting device 1*a* according to the embodiment, since the LED elements 3 to 6 are embedded in the resin molded body 2 to be fixed in the resin molded body 2, mounting positions of the LED elements 3 to 6 in the light emitting device 1*a* are accurately determined in accordance with installation positions of the LED elements 3 to 6 in the temporary fixing films 11 and 12 in the temporary fixing process. Thus, the following effects can be obtained.

(4) Accurate accuracy of about accuracy±50 μm in an LED element mounting machine is obtained as accuracy of mounting positions in a plane direction (X-Y direction) of the LED elements 3 to 6 in the light emitting device 1*a*.

(5) In addition, accuracy of positions of the LED elements 3 to 6 in a height direction (H direction) in the light emitting device 1*a* can be minimized within several μm of about an application thickness variation of the adhesive used in the temporary fixing process.

Also, since heat treatment at 260° C. or more required for curing a solder material in the related art is not required in the manufacturing method of the light emitting device 1*a* according to the embodiment, the following effects can be obtained.

(6) Since high heat is not applied to the LED elements 3 to 6, a change in light emission characteristic in the LED elements 3 to 6 can be minimized.

Since the manufacturing method of the light emitting device 1*a* according to the embodiment does not have a process of adding a printed board, a process of forming an extremely narrow wiring or a process of forming wirings on both surfaces in a printed board, and a complicated process such as assembly of other members and the LED elements 3 to 6, the following effects can be obtained.

(7) A factor of decreasing a manufacturing yield of the light emitting device 1*a* can be eliminated or parts costs and manufacturing costs of the light emitting device 1*a* can be reduced.

Note that the light emitting device 1 according to Embodiment 1 illustrated in FIGS. 1(*a*) to (*c*) can be manufactured by a method that is basically the same as the manufacturing method illustrated in FIGS. 5(*a*) to (*d*). Note that, when the light emitting device 1 illustrated in FIGS. 1(*a*) to (*c*) is manufactured, the LED elements 3 to 6 may be temporarily fixed only to the temporary fixing film 12 during the temporary fixing process, and thus the temporary fixing film 11 need not be used. In addition, since the wiring may be formed only in the hack surface 23 of the resin molded body 2 during the wiring forming process, the wiring forming process in the front surface 21 of the resin molded body 2 illustrated in FIG. 5(*d*) is also unnecessary.

Embodiment 3

Embodiment 3 of the present invention will be described below with reference to FIGS. 6(*a*) and (*b*). Note that, for convenience of explanation, members having functions that are the same as that of the members described in the above-described embodiment will be denoted with the same reference numerals and description thereof will be omitted.

FIGS. 6(*a*) and (*b*) are diagrams showing a configuration of a backlight device 90 according to Embodiment 3 of the present invention. FIG. 6(*a*) is a diagram of the backlight device 90 viewed from an upper surface thereof and FIG. 6(*b*) is a diagram of the light emitting device 1*a* mounted in the backlight device 90 viewed from a light emitting surface thereof.

As shown in FIG. 6(*a*), the backlight device 90 includes a resin frame 91, a light guide plate 92, and a light emitting device 1*a*. The resin frame 91 fixes the light guide plate 92 to be arranged to surround the light guide plate 92. The light emitting device 1*a* is arranged in such a way that the light emitting surface thereof faces any lateral surface in the light guide plate 92. Furthermore, the light emitting device 1*a* is embedded in the resin frame 91.

In the light emitting device 1*a* having such a configuration, light emitted from the light emitting surface of the light emitting device 1*a* is introduced from the lateral surface of the light guide plate 92 into the light guide plate 92, reflected inside the light guide plate 92, and radiated from an upper surface of the light guide plate 92. Therefore, the backlight device 90 can be suitably used for various display devices as an edge light type backlight device.

Advantages of Embodiment

An edge light type backlight device is widely used in various display devices such as a display module of a portable type terminal device, a laptop type personal computer, and a liquid crystal monitor. At present, thinning of the edge light type backlight device is strongly required along with thinning of such devices. Here, as shown in FIG. 6(*b*), since a thickness 93 of the light emitting device 1*a* according to the embodiment can be substantially the same as a thickness of the LED elements 3 to 6, an LED mounting part of the backlight device 90 including the light emitting device 1*a* can be minimized to the thickness of the LED elements 3 to 6. Therefore, the backlight device 90 can be made thinner.

Also, since the light emitting device 1*a* is embedded in the resin frame 91 in the backlight device 90, a size of the backlight device 90 in a plane direction can also be decreased.

CONCLUSION

In order to solve the above-described problems, a light emitting device according to an aspect of the present invention includes: a resin molded body; a light emitting element including at least a light emitting unit and an electrode and embedded in the resin molded body so that the light emitting unit is exposed on a first surface in the resin molded body and the electrode is exposed on a second surface which is perpendicular to the first surface in the resin molded body; and a wiring formed in the second surface in the resin molded body and connected to the electrode.

According to the above configuration, the light emitting element is mounted in the light emitting device in such a way that the light emitting element is embedded in the resin molded body. For this reason, since a printed board configured to mount the light emitting element is not required, a height of the light emitting device can be made to substantially match a height of the light emitting element (resin molded body). Furthermore, since a wiring connected to the electrode of the light emitting element exposed on the second surface of the resin molded body can be formed using printing, a solder material for connection need not be used. Thus, since a space for a solder material between light emitting elements becomes unnecessary, mounting pitches between the light emitting elements can be minimized.

As described above, according to the above configuration, the light emitting device which is further miniaturized and thinned can be realized.

In the light emitting device according to an aspect of the present invention, a plurality of light emitting elements are embedded in the resin molded body and the electrodes included in the light emitting elements are connected to each other through the wirings.

According to the above configuration, the light emitting device including the plurality of light emitting elements can be realized.

In the light emitting device according to an aspect of the present invention, a plurality of light emitting elements are embedded in the resin molded body, each of the light emitting elements include another electrode, the other electrode is exposed on a third surface which is perpendicular to the first surface of the resin molded body and faces the second surface thereof, and another wiring formed in the third surface of the resin molded body and connected to the other electrode is further provided.

According to the above configuration, the light emitting device including the plurality of light emitting elements can be realized.

In the light emitting device according to an aspect of the present invention, the electrode and the other electrode are integrally formed.

According to the above configuration, a wiring in a second surface of a resin molded body and a wiring in a third surface of the resin molded body can be electrically connected to each other through an electrode or another electrode. Thus, the light emitting device with a configuration in which some of the plurality of light emitting elements of the plurality of light emitting elements and the others thereof are connected in parallel can be realized.

In a light emitting device according to an aspect of the present invention, the plurality of light emitting elements are linearly arranged.

According to the above configuration, the light emitting device which can be suitably incorporated in an edge light type backlight device can be realized.

In a light emitting device according to an aspect of the present invention, the light emitting element is a light emitting diode (LED) element.

According to the above configuration, the light emitting device with low power consumption can be realized.

In order to solve the above-described problems, a backlight device according to an aspect of the present invention includes: a light guide plate; and any of the above-described light emitting devices arranged to face any lateral surface of the light guide plate.

According to the above configuration, the backlight device which is further miniaturized and thinned can be realized.

A backlight device according to an aspect of the present invention further includes: a resin frame to which the light guide plate is fixed, wherein the light emitting device is embedded in the resin frame.

According to the above configuration, a size of the backlight device in a plane direction can be decreased.

In order to solve the above-described problems, a manufacturing method of a light emitting device according to an aspect of the present invention includes: a step of temporarily fixing a light emitting element including at least a light emitting unit and an electrode formed in a surface which is perpendicular to a surface in which the light emitting unit is formed to a temporary fixing film in such a way that the electrode is in contact with the temporary fixing film; a step of forming a resin molded body in which the light emitting element is embedded by arranging the temporary fixing film in which the light emitting element is temporarily fixed in a gap in a mold and injecting a resin material into the gap; a step of peeling the temporary fixing film off the resin molded body; and a step of forming a wiring connected to the electrode in a surface on which the electrode in the resin molded body is exposed.

According to the above configuration, the light emitting device which is further miniaturized and thinned can be more easily manufactured.

The present invention is not limited to the above-described embodiments and various modifications thereof are possible within the scope of the claims. Embodiments obtained by appropriately combining technical means disclosed in different embodiments are also included in the technical scope of the present invention. New technical features can also be formed by combining technical means disclosed in embodiments.

What is claimed is:

1. A light emitting device comprising:

a resin molded body;

a light emitting element comprising at least a light emitting diode chip and an electrode, and embedded in the resin molded body so that the light emitting diode chip is exposed on a first surface in the resin molded body and the electrode is exposed on a second surface which is perpendicular to the first surface in the resin molded body; and a wiring formed in the second surface in the resin molded body and connected to the electrode, wherein a surface of the light emitting diode chip is coplanar with the first surface of the resin molded body, wherein a thickness of the light emitting diode chip is equal to a thickness of the resin molded body in a direction perpendicular to the second surface.

2. The light emitting device according to claim 1, wherein a plurality of the light emitting elements are embedded in the resin molded body and a plurality of the electrodes comprised in the light emitting elements are connected to each other through a plurality of the wirings.

3. The light emitting device according to claim 2, wherein the plurality of light emitting elements are linearly arranged.

4. The light emitting device according to claim 3, wherein the light emitting element is a light emitting diode (LED) element.

5. A backlight device comprising:

a light guide plate; and the light emitting devices according to claim 3 arranged to face any lateral surface of the light guide plate.

6. The light emitting device according to claim 2, wherein the light emitting element is a light emitting diode (LED) element.

7. A backlight device comprising:

a light guide plate; and the light emitting devices according to claim 2 arranged to face any lateral surface of the light guide plate.

8. The light emitting device according to claim 1, wherein a plurality of the light emitting elements are embedded in the resin molded body, each of the light emitting elements comprises an other electrode, the other electrode is exposed on a third surface which is perpendicular to the first surface of the resin molded body and faces the second surface thereof, and an other wiring formed in the third surface of the resin molded body and connected to the other electrode is further provided.

9. The light emitting device according to claim 8, wherein the electrode and the other electrode are integrally formed.

10. The light emitting device according to claim 9, wherein the plurality of light emitting elements are linearly arranged.

11. The light emitting device according to claim 9, wherein the light emitting element is a light emitting diode (LED) element.

12. A backlight device comprising:

a light guide plate; and the light emitting devices according to claim 9 arranged to face any lateral surface of the light guide plate.

13. The light emitting device according to claim 8, wherein the plurality of light emitting elements are linearly arranged.

14. The light emitting device according to claim 8, wherein the light emitting element is a light emitting diode (LED) element.

15. A backlight device comprising:

a light guide plate; and the light emitting devices according to claim 8 arranged to face any lateral surface of the light guide plate.

16. The light emitting device according to claim 1, wherein the light emitting element is a light emitting diode (LED) element.

17. A backlight device comprising:

a light guide plate; and the light emitting devices according to claim 16 arranged to face any lateral surface of the light guide plate.

18. A backlight device comprising:

a light guide plate; and the light emitting devices according to claim 1 arranged to face any lateral surface of the light guide plate.

19. The backlight device according to claim 18, further comprising:

a resin frame to which the light guide plate is fixed, wherein the light emitting device is embedded in the resin frame.

20. A manufacturing method of a light emitting device comprising:

a step of temporarily fixing a light emitting element comprising at least a light emitting diode chip and an electrode formed in a first surface which is perpendicular to a second surface in which the light emitting diode chip is formed to a temporary fixing film in such a way that the electrode is in contact with the temporary fixing film;

a step of forming a resin molded body in which the light emitting element is embedded by arranging the temporary fixing film in which the light emitting element is temporarily fixed in a gap in a mold and injecting a resin material into the gap;

a step of peeling the temporary fixing film off the resin molded body; and a step of forming a wiring connected to the electrode in a surface on which the electrode in the resin molded body is exposed, wherein a surface of the light emitting diode chip is coplanar with the first surface of the resin molded body, wherein a thickness of the light-emitting diode chip is equal to a thickness of the resin molded body in a direction perpendicular to the second surface.

* * * * *